United States Patent
Boeh

(10) Patent No.: US 7,243,036 B2
(45) Date of Patent: Jul. 10, 2007

(54) SYSTEM AND METHOD FOR CALIBRATING THE CLOCK FREQUENCY OF A CLOCK GENERATOR UNIT OVER A DATA LINE

(75) Inventor: Frank Boeh, Buchholz (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/544,608

(22) PCT Filed: Feb. 4, 2004

(86) PCT No.: PCT/IB2004/000268

§ 371 (c)(1),
(2), (4) Date: Aug. 4, 2005

(87) PCT Pub. No.: WO2004/070937

PCT Pub. Date: Aug. 19, 2004

(65) Prior Publication Data

US 2006/0161367 A1    Jul. 20, 2006

(30) Foreign Application Priority Data

Feb. 7, 2003  (EP) .................................. 03100255

(51) Int. Cl.
*G01R 35/00* (2006.01)
*G01R 23/00* (2006.01)

(52) U.S. Cl. ........................................ 702/106; 331/44

(58) Field of Classification Search ................ 702/106, 702/107, 85; 375/373, 362; 331/1 R, 44; 327/156; 73/1.01
See application file for complete search history.

(56) References Cited

U.S. PATENT DOCUMENTS 4,228,346 A * 10/1980 Barker ......................... 377/29
5,493,710 A * 2/1996 Takahara et al. ........... 455/192.2
5,912,632 A * 6/1999 Dieska et al. .............. 340/10.5
6,053,947 A * 4/2000 Parson ......................... 703/14
6,472,943 B1 * 10/2002 Soong et al. ................. 331/44
6,622,106 B2 * 9/2003 Rocchi et al. .............. 702/107

(Continued)

*Primary Examiner*—Donald E. McElheny, Jr.
*Assistant Examiner*—Toan M. Le

(57) ABSTRACT

In order to further develop a system (100) and a method for calibrating the clock frequency of at least one clock generator unit (38), in particular oscillator unit, that is assigned to at least one transmitting/receiving module (30), wherein—the transmitting/receiving module (30) communicates with at least one microcontroller unit (10) over at least one data line (20) and—the clock generator unit (38) is assigned at least one calibration unit (36), in such a manner that with significantly reduced system costs the clock frequency of the clock generator unit (38) can be calibrated with very high accuracy, it is proposed that—in order to calibrate the clock frequency of the clock generator unit (38) at least one calibration unit (36) is assigned to the clock generator unit 38, —the calibration unit (36) can be set in binary terms by means of at least one command signal (COM) via the data line (20), —the clock generator unit (38) is assigned at least one binary counter (34) that is clocked by the clock generator unit (38), in particular by the output frequency (fout) of the clock generator unit (38) and— within the transmitting/receiving module (30) there is at least one control logic mechanism (32) which is connected (STA, OFL or SET) to the calibration unit (36) or to the binary counter (34), which control logic mechanism, following reception of the command signal (COM), resets the binary counter (34), starts it (STA) and awaits the expiry or overflow (OFL) of the binary counter (34).

15 Claims, 3 Drawing Sheets

U.S. PATENT DOCUMENTS

Figure 1:
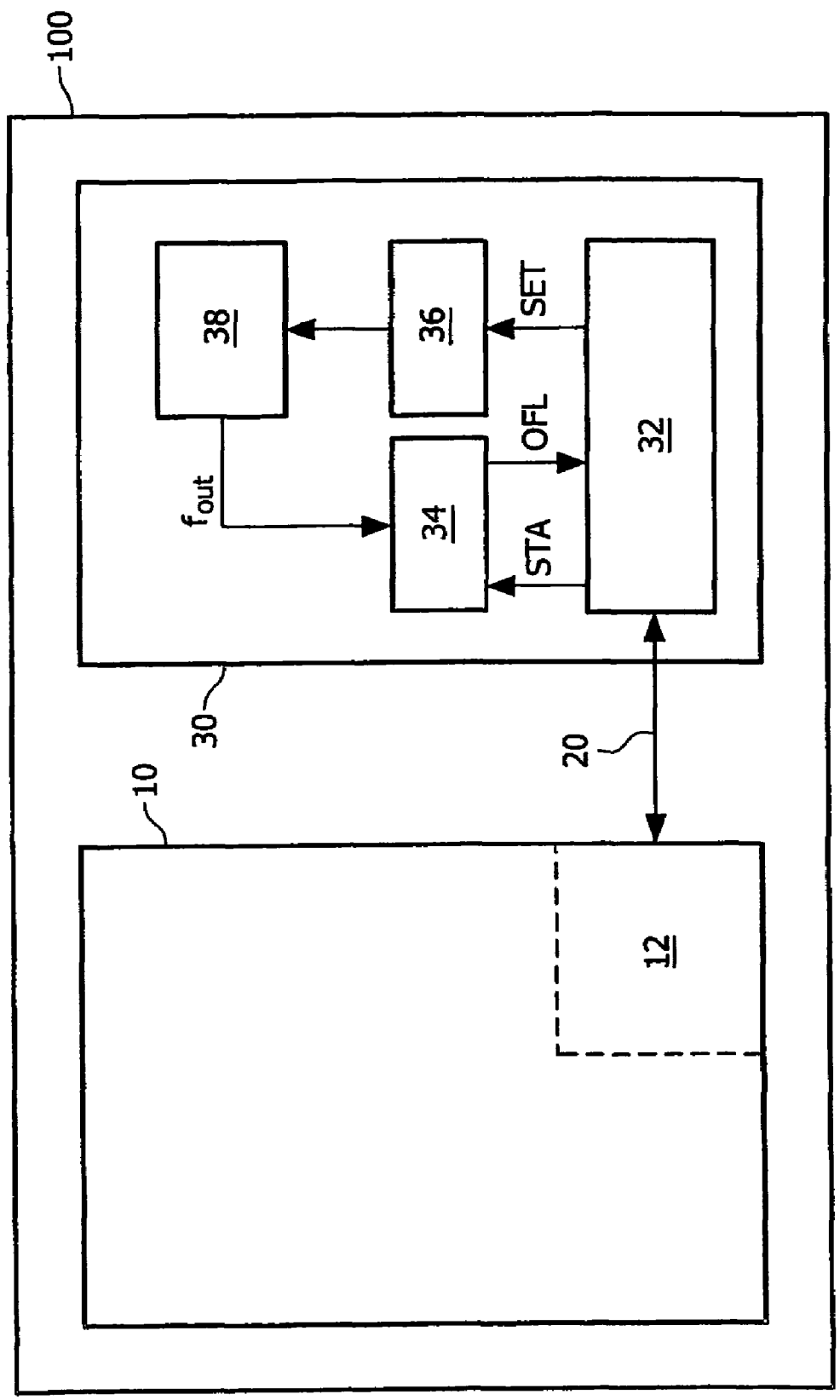

| | | | |
|---|---|---|---|
| 6,687,293 B1 * | 2/2004 | Loyer et al. | 375/239 |
| 6,700,931 B1 * | 3/2004 | Lee et al. | 375/239 |
| 6,784,813 B2 * | 8/2004 | Shanks et al. | 341/53 |
| 6,864,800 B2 * | 3/2005 | Leichfried et al. | 340/825.72 |
| 6,898,538 B2 * | 5/2005 | Tailliet | 702/79 |
| 6,925,402 B2 * | 8/2005 | Shah et al. | 702/89 |
| 7,078,952 B2 * | 7/2006 | Ruat et al. | 327/291 |

* cited by examiner

SYSTEM AND METHOD FOR CALIBRATING THE CLOCK FREQUENCY OF A CLOCK GENERATOR UNIT OVER A DATA LINE

The present invention relates to a system
having at least one microcontroller unit and
having at least one transmitting/receiving module which has at least one clock generator unit, in particular at least one oscillator unit,
where the microcontroller unit and the transmitting/receiving module are connected to one another for communication over at least one data line.

The present invention furthermore relates to a method of calibrating the clock frequency of at least one clock generator unit, in particular oscillator unit, that is assigned to at least one transmitting/receiving module.

Clocked systems which are connected via a data line and in which the accuracy of the clock generators (oscillators) is important are used, for example, in electronic immobilizers for cars, and in particular in the control circuits located in the car.

Such control circuits typically have a microcontroller which is connected to a transmitting/receiving module via one or more data lines. Both circuits require a precise clock generator since the microcontroller derives therefrom a large number of time parameters for communication with its environment, while the transmitting/receiving module generates therefrom the alternating field of typically 125 kilohertz that is required for operation of the transponder. This alternating field must likewise be sufficiently accurate, since the antenna of the transmitting/receiving module is generally designed as a tuned resonant circuit with a small bandwidth and a high quality, as is the antenna of the transponder.

Both circuits are often separate from one another in spatial terms on account of the mechanical design of the car; therefore, just one or more data lines and power supply lines connect these circuits. This spatial separation means that a dual design of the clock generator mechanism is necessary, so that conventional systems from the prior art generally use a quartz oscillator or ceramic oscillator of suitable frequency on each side.

These relatively expensive components considerably add to the system costs, with even more complex systems being conceivable in practice in which a large number of precise clock generators are used, generally quartz oscillators or ceramic oscillators.

In order to optimize the system costs, the precise oscillator (generally quartz oscillator or ceramic oscillator) may be replaced in the transmitting/receiving module by an oscillator with low accuracy. RC oscillators or LC oscillators can be used for this; other variants are also conceivable.

If, for example, an RC oscillator is considered, the latter derives a frequency from a network of resistance (R) and capacitance (C), by means of which a time constant $\tau=R*C$ is formed. A corresponding oscillator circuit can be fully integrated in the transmitting/receiving module, saves energy and space and has a fast and unproblematic start response. The tolerances of R and C which result from integration, however, lead to a highly inaccurate output frequency of this clock generator (--> tolerances of typically +/−30 percent).

In order to increase the accuracy, the oscillator may be designed such that it can be calibrated. For this purpose, one of the two frequency-determining parameters, typically R, is made such that it can be varied. The calibration is carried out in this case using a resistor chain that can be switched digitally, said calibration typically being implemented during the production test and being permanently stored.

However, no effects of temperature and aging can be taken into account here, so that a high residual tolerance of temperature and aging (typically +/−5 percent to +/−10 percent) remains after calibration has been carried out. But this accuracy which can be achieved according to the prior art is not sufficient for the application example described; an accuracy of the RC oscillator of +/−0.5 percent after calibration has been carried out is desired in this case.

Based on the disadvantages and shortcomings described above, and in acknowledgement of the prior art outlined above, it is an object of the present invention to further develop a system of the type mentioned above and a method of the type mentioned above in such a manner that with significantly reduced system costs the clock frequency of a clock generator unit can be calibrated with very high accuracy.

This object is achieved by a system having the features specified in claim 1 and by a method having the features specified in claim 3. Advantageous refinements and expedient developments of the present invention are characterized in the respective subclaims.

The system described below and also the method described below, according to the present invention, calibrate in principle any number of inaccurate oscillator units using just one precise reference to the running time of the system, in such a manner that it can be repeated as often as desired. The effects of temperature and aging can thereby be omitted, which greatly increases the accuracy that can be achieved.

According to the teaching of the present invention, a quartz oscillator or ceramic oscillator is used as reference for all further clock generator units, which may all be designed as RC oscillators. These clock generator units are calibrated over the existing data line by the method according to the present invention in a manner such that, following calibration, there is an increased accuracy of the clock generator units, said accuracy being sufficient for example for control circuits in electronic immobilizers in cars.

The system and also the method advantageously make use of one or more existing data lines, over which the microcontroller unit can communicate with the transmitting/receiving module. In this connection, by way of example it may be assumed that all the communication takes place over a single line, which may also be referred to as the "C[ommunication] line"; in principle, however, the method can also be used on systems which communicate over a number of lines.

The transmitting/receiving module which is in communication connection with the microcontroller unit over the data line(s) has, besides the clock generator unit (=RC oscillator whose nominal frequency ought to correspond to the desired frequency that is to be set: so-called mean tuning setting), at least one calibration unit or a calibration mechanism for the clock generator unit; this calibration unit can be set in binary terms by means of at least one specific (calibration) command signal via the data line, where the setting range, in particular the number of setting steps, preferably ought to correspond to a power of two.

Furthermore, the clock generator unit is assigned at least one binary counter which is clocked directly in particular by the output frequency of the clock generator unit and also a control logic mechanism which, following reception of the command signal, resets the binary counter, starts it and awaits the expiry or overflow of the binary counter. The start and expiry or overflow of the binary counter are indicated as a suitable signal on the data line.

The calibration of the clock frequency of the clock generator unit, in particular oscillator unit, is effected by the microcontroller unit by the following method steps being carried out:

[a] assumption of a starting value for the calibration value of the clock generator unit;

[b.1] composition and transmission of at least one command signal over the data line;

[b.2] binary setting of the calibration value by means of the command signal;

[c] measurement of the time which passes until expiry or overflow of at least one binary counter that is assigned to the clock generator unit and is clocked by the clock generator unit, in particular by the output frequency of the clock generator unit, by observing at least one signal on the data line, said signal being generated by the transmitting/receiving module;

[d] comparison of the time measured in step [c] with the expected time corresponding to the number of counting steps of the binary counter divided by the desired frequency of the clock generator unit;

[e] if the time measured in step [c] does not correspond to the expected time:

correction of the calibration value, in particular using the method of successive approximation, and repetition of the measurement of the time starting from step [b.1].

Preferably, an algorithm in accordance with the method of successive approximation can be used to correct the calibration value. In order to determine the optimal calibration value, such an algorithm requires just one pass (steps [b.1] to [e]) per bit of the calibration value.

If, now, with reference to the present invention it is expediently assumed that the binary setting range (corresponding to the number of setting steps) for the calibration is a power of two, then the expanded algorithm is as follows (it is assumed that smaller values of the calibration value correspond to a smaller frequency of the clock generator unit):

[a.1] assumption of an imperceptible starting value (CAL=0) for the calibration value of the clock generator unit;

[a.2] setting of a step value to half the binary setting range for the calibration value (STE=0.5*setting range), where the binary setting range of the calibration unit corresponds to a power of two;

[a.3] setting of the new calibration value (CAL=CAL+STE) as the sum of the starting value from step [a.1] and the step value from step [a.2];

[b.1] composition and transmission of at least one command signal over the data line;

[b.2] binary setting of the calibration value by means of the command signal;

[c] measurement of the time which passes until expiry or overflow of at least one binary counter that is assigned to the clock generator unit and is clocked by the clock generator unit, in particular by the output frequency of the clock generator unit, by observing at least one signal on the data line, said signal being generated by the transmitting/receiving module;

[d] comparison of the time measured in step [c] with the expected time corresponding to the number of counting steps of the binary counter divided by the desired frequency of the clock generator unit;

[e] if the time measured in step [c] is shorter than the expected time:

setting of the new calibration value (CAL=CAL−STE) as the difference between the calibration value from step [a.3] and the step value from step [a.2] or from step [f];

[f] setting of the step value (STE=0.5*STE) to half the step value up to now;

[g] if the step value set in step [f] is greater than or equal to 1:

setting of the new calibration value (CAL=CAL+STE) as the sum of the calibration value from step [e] and the step value from step [f];

[h] go to step [b.1].

Without modification, the method described above is based on the fact that the frequency of the clock generator unit that is achieved is always smaller than or equal to the desired frequency; this leads to the remaining tolerance lying unsymmetrically around the optimum. A tolerance that is arranged symmetrically around the optimum can easily be obtained by the expected time, that is to say the precise reference with which the measured time that is generated by the clock generator unit is compared, being shortened by half the remaining tolerance according to a preferred refinement of the present invention.

Since according to the invention the measurement of the time in the microcontroller unit is carried out very precisely, the calibration of the clock generator unit, in particular of the oscillator unit, in particular of the RC oscillator, that has been carried out is also accordingly precise apart from the following quantization losses:

final setting accuracy of the calibration of the clock generator unit;

final resolution of the time measurement by the microcontroller unit;

tolerance of the precise oscillator unit (quartz oscillator or ceramic oscillator) of the microcontroller unit;

measurement accuracies on the data line, such as
final and/or different rise and fall times,
jitter,
noise,
interference signals;

any system-inherent tolerances of the clock generator unit such as jitter and temperature drift during normal operation after calibration has been carried out.

According to a particularly advantageous development of the present invention, the last-used calibration value can be used as an optimal starting value for a subsequent recalibration; after each calibration has been carried out, this recalibration is permanently stored in the microcontroller unit, for example in at least one E[lectrically]E[rasable]P[rogrammable]R[ead]O[nly]M[emory].

Expediently, a number of calibrations and measurements are then carried out using this value and using the value that has been decreased or increased in steps, until the correct calibration is found. If the correct value is not found after a certain number of steps, the method of successive approximation can be used instead.

A further preferred variant of the present invention serves to increase the immunity with respect to signal interference on the data line (=C line). After calibration has been carried out, the calibration command is executed once more with the previously determined calibration value and the result is checked; if the measured time does not match, the complete calibration is repeated (the probability that signal interference will occur at the same time in two successive identical measurements is very small).

Additional interference protection can be achieved in a manner essential to the invention by adding in plausibility checks. Here, the measured times are compared between the individual calibration steps. The measurements may have been falsified by signal interference in such a manner that, for example, with a calibration value which corresponds to a smaller frequency a shorter measurement time would be determined. In such cases, the calibration is started anew.

According to a further expedient variant of the present invention, selected regular command signals of the system which are transmitted over the data line (C line) are expanded such that after termination thereof the described measurement cycle is carried out. Thus, during continuous operation a check can continually be made in a simple manner as to whether the calibration is still operating within the permitted parameters, without executing the calibration command (<--> time saving).

As a consequence of the described mode of operation of the method according to the present invention, the system according to the present invention has the following advantages:

significant reduction in system costs
- by integration of the clock generator with relatively low accuracy and
- by reducing the number of quartz oscillators or ceramic oscillators that are required to just one;

reduction in the required number of pins for an external quartz by fill integration of the clock generator (--> smaller and more cost-effective chip housing);

simple possibility to change the oscillation frequency (<--> adaptation to antenna resonant frequency, frequency modulation);

increase in system reliability by omitting the risk of non-stimulation of oscillations of quartz oscillators or ceramic oscillators;

low energy consumption of RC oscillators compared to quartz oscillators or ceramic oscillators.

The present invention finally relates to the use of at least one system of the type mentioned above and/or of the method of the type mentioned above, in cases in which more that one precision clock generator is required and in which the energy consumption and/or the system costs are critical, such as, for example in contactless chip cards in identification or access control systems (so-called P[assive]K[eyless]E[ntry] systems),
in devices for immobilizers in motor vehicle keys,
in electronic luggage tags for the automatic distribution and sorting of items of luggage during luggage handling, for instance at airports, and
in electronic memories for sorting and tracking in the case of packet transport.

As already mentioned above, there are various possibilities for advantageously refining and developing the teaching of the present invention. For this purpose, on the one hand reference is made to the claims that are in each case subordinate to claim 1 and claim 3 and on the other hand a more detailed description is given below of further refinements, features and advantages of the present invention, with reference to the example of embodiment shown in FIGS. 1 to 3.

The invention will be further described with reference to an example of embodiment shown in the drawings to which, however, the invention is not restricted.

FIG. 1 schematically shows an example of embodiment of a system according to the present invention, which is used for the method according to the present invention.

Figure 2:
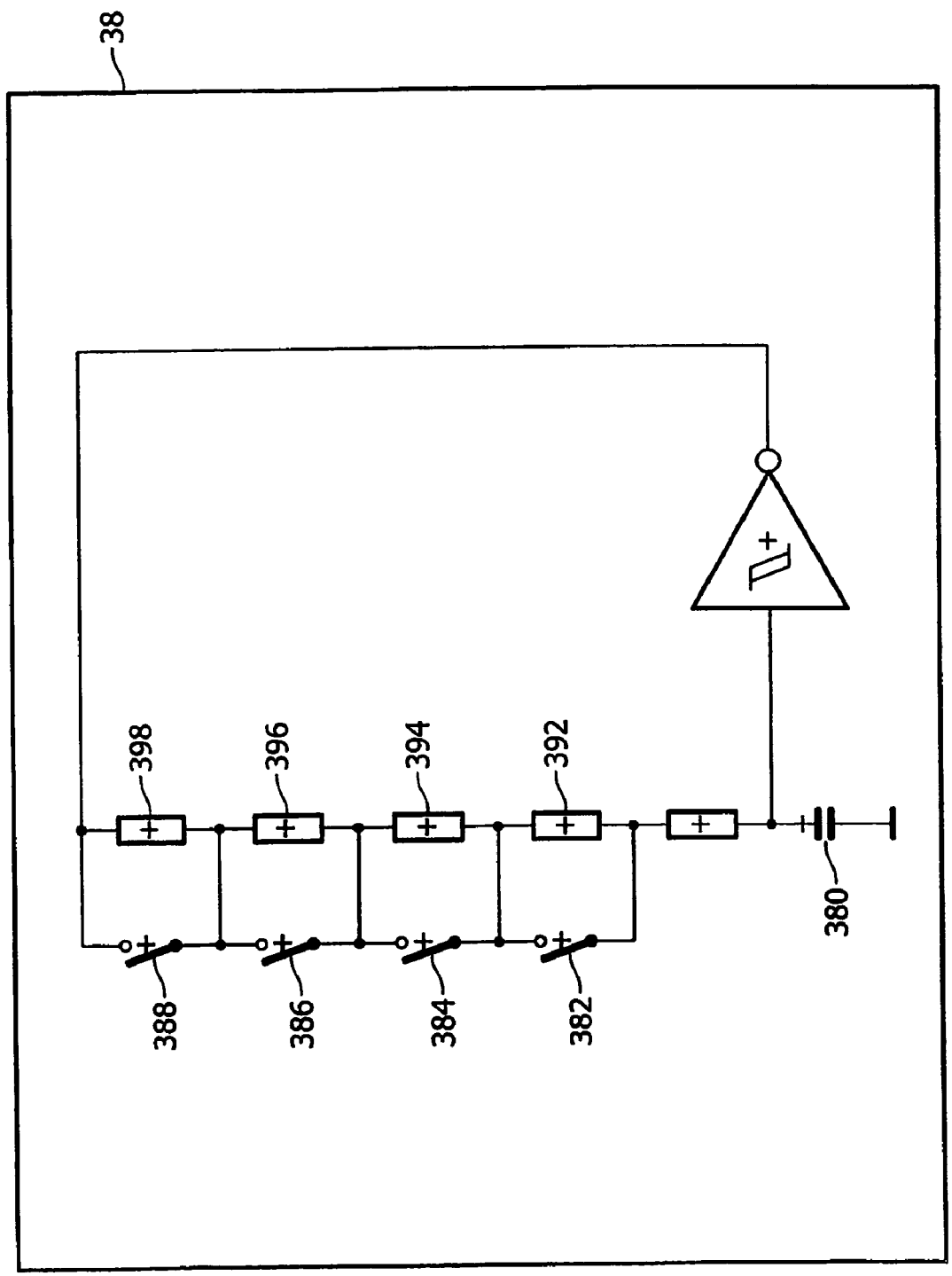

FIG. 2 schematically shows an example of embodiment of a clock generator unit that can be calibrated, said clock generator unit being designed as an RC oscillator unit that can be calibrated.

Figure 3:
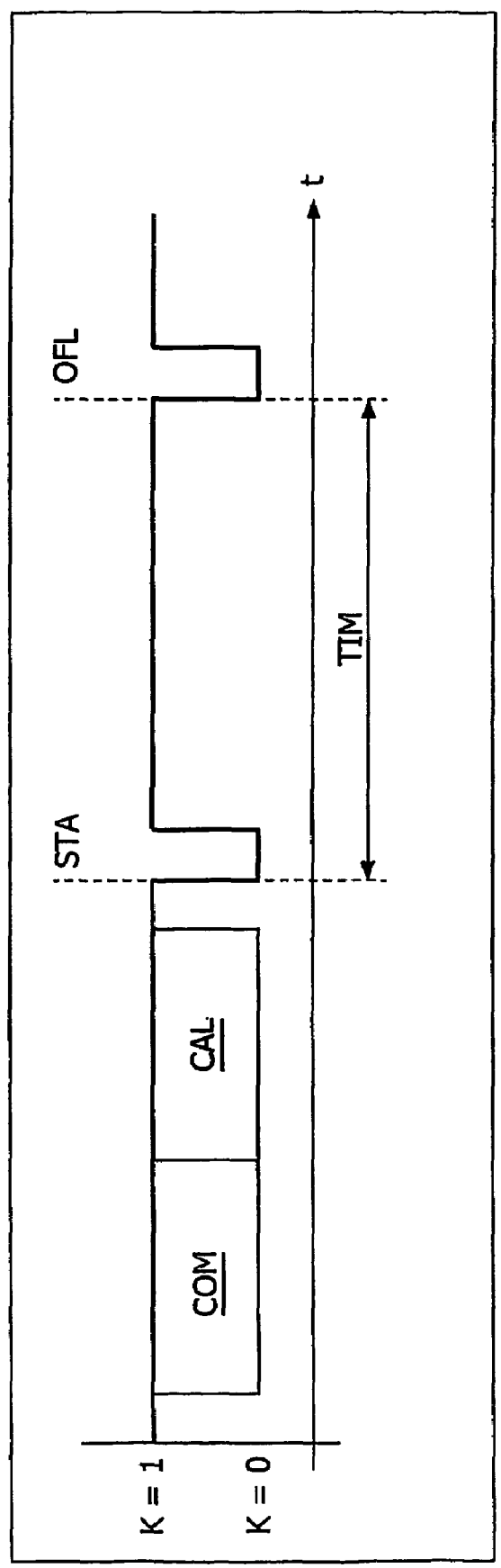

FIG. 3 schematically shows an example of embodiment of the signal profile, plotted against the time (axis), of a calibration command on the data line between the microcontroller unit of the system shown in FIG. 1 and the transmitting/receiving module of the system shown in FIG. 1.

Identical or similar arrangements, elements or features are provided with identical reference numerals in FIGS. 1 to 3.

FIG. 1 shows an example of embodiment of a system 100 according to the present invention. This system 100 has a microcontroller unit 10 and a transmitting/receiving module 30, where the transmitting/receiving module 30 inter alia comprises a clock generator unit 38 in the form of an RC oscillator with capacitive element C (reference numeral 380).

In order to increase the accuracy, the RC oscillator is designed such that it can be calibrated. For this purpose, one of the two frequency-determining parameters, according to the example of embodiment in FIG. 2 the ohmic resistance R, is made such that it can be varied. The calibration is carried out in this case using a resistor chain 390, 392, 394, 396, 398 that can be switched digitally (--> reference numerals 382, 384, 386, 388), said calibration typically being implemented during the production test and being permanently stored.

The two clocked units, namely microcontroller 10 and transmitting/receiving module 30, are coupled to one another over a data line 20 (so-called communication line or C line; cf. FIG. 3: communication parameter K=0: no communication; K=1: communication) and are used as a (complete) system 100 for example in electronic immobilizers for cars, and in particular in the separate ("active") control and transmission circuits located in the car; not least for this reason, the accuracy of the clock generators (oscillators) is highly important.

Specifically, such control circuits have a microcontroller 10 which is connected to the transmitting/receiving module 30 over one (or more) data lines (in FIG. 1: a bidirectional data line 20). Both circuits require a precise clock generator since the microcontroller 10 derives therefrom a large number of time parameters for communication with its environment, while the transmitting/receiving module 30 generates therefrom the alternating field of typically 125 kilohertz that is required for operation of the transponder. This alternating field must likewise be sufficiently accurate, since the antenna of the transmitting/receiving module 30 is generally designed as a tuned resonant circuit with a small bandwidth and a high quality, as is the antenna of the transponder.

As can be seen from FIG. 1, both circuits are often separate from one another in spatial terms on account of the mechanical design of the car; only the data line 20 and power supply lines (which are not shown explicitly in FIG. 1 for reasons of clarity) connect these circuits.

Since this spatial separation of microcontroller unit 10 and transmitting/receiving module 30 is intended not to make a dual design of the clock generator mechanism necessary, but rather to effect precise clock generation brought about by a single quartz oscillator or ceramic oscillator, in the example of embodiment of the present invention shown in FIG. 1 a calibration unit 36 is assigned to this clock generator unit 38 for the purpose of calibrating the clock frequency.

This calibration unit 36 can be set in binary terms by means of a command signal COM (cf. FIG. 3) via the data line 20, where the binary setting range, specifically the number of setting steps, of the calibration unit 36 corresponds to a power of two. For this purpose, a control logic mechanism 32 that is connected to the data line or C line 20 is connected upstream of the calibration unit 36 within the transmitting/receiving module 30 (--> command for setting SET from the control logic mechanism 32 to the calibration unit 36).

Furthermore, the control logic mechanism 32 is connected to a binary counter 34 that is connected downstream of the clock generator unit 38. This binary counter 34 is clocked by the clock generator unit 38, in particular by the output frequency $f_{out}$ of the clock generator unit 38, and, following reception of the command signal COM, resets the binary counter 34, starts it (--> STA; cf. FIG. 3) and awaits the expiry or overflow OFL (cf. FIG. 3) of the binary counter 34.

The method of calibrating the clock frequency of the clock generator unit 38 (=RC oscillator unit) assigned to the transmitting/receiving module 30 then has the following steps:

[a] assumption of a starting value for the calibration value CAL (cf. FIG. 3) of the clock generator unit 38;

[a.1] assumption of an imperceptible starting value CAL=0 for the calibration value CAL of the clock generator unit 38;

[a.2] setting of a step value STE to half the binary setting range for the calibration value (STE=0.5*setting range), where the binary setting range of the calibration unit 36 corresponds to a power of two;

[a.3] setting of the new calibration value (CAL=CAL+STE) as the sum of the starting value CAL from step [a.1] and the step value STE from step [a.2];

[b.1] composition and transmission of at least one command signal COM (together with the current calibration value CAL) over the data line 20;

[b.2] binary setting of the calibration value CAL by means of the command signal COM;

[c] measurement of the time interval TIM (cf. FIG. 3) which passes until expiry or overflow OFL of at least one binary counter 34 that is assigned to the clock generator unit 38 and is clocked by the clock generator unit 38, in particular by the output frequency $f_{out}$ of the clock generator unit 38, by observing at least one signal on the data line 20, said signal being generated by the transmitting/receiving module 30; here, the time interval TIM is measured using a timer unit 12 that is assigned to the microcontroller unit 10 and has a clock frequency of, for example, approximately one megahertz;

[d] comparison of the time interval TIM measured in step [c] with the expected time interval (precise reference) corresponding to the number of counting steps of the binary counter 34 divided by the desired frequency of the clock generator unit 38, where the expected time interval may be shortened by half the remaining tolerance in order to bring about a tolerance that is arranged around the optimum;

[e] if the time interval TIM measured in step [c] does not correspond to the expected time interval:

correction of the calibration value CAL, in particular using the method of successive approximation, and repetition of the measurement of the time interval TIM starting from step [b.1];

specifically: if the time interval TIM measured in step [c] is shorter than the expected time interval:

setting of the new calibration value (CAL=CAL−STE) as the difference between the calibration value CAL from step [a.3] and the step value STE from step [a.2] or from step [f], where the last-used calibration value CAL from step [e] may be set as the starting value for a subsequent recalibration in step [a];

[f] setting of the step value (STE=0.5*STE) to half the step value up to now;

[g] if the step value STE set in step [f] is greater than or equal to 1:

setting of the new calibration value (CAL=CAL+STE) as the sum of the calibration value CAL from step [e] and the step value STE from step [f];

[h] go to step [b.1].

Finally, in an exemplary calculation it is shown that the abovementioned method gives a satisfactory result in the present example of embodiment and application example:

A binary setting range for the calibration of seven bits is used as a basis. With an assumed basic accuracy of the clock generator unit 38 of +/−30 percent the result is a setting accuracy of the RC oscillator 38 of d1=30%/$2^7$=0.23%.

The time measurement using the microcontroller 10 is effected with the aid of the timer 12. A clock frequency of this timer 12 of one megahertz is assumed. Furthermore, it is assumed that the timer 12 is configured such that it can be started and stopped directly by the signal on the data line or C line 20 for time measurement purposes; accordingly, there are only synchronization losses during starting of the timer 12 at the start and at the end of the time interval TIM to be measured.

The accuracy of the time measurement depends on the length of the time interval TIM to be measured, which time interval TIM for the purposes of calibration is generated by the transmitting/receiving module 30 on the data line or C line 20. A time of 512 microseconds is assumed in this case. The accuracy of the time measurement is then calculated as d2=2*0.5 μs/512 μs=0.2%.

In conclusion, a frequency tolerance of the RC oscillator 38 of +/−0.43 percent is thereby achieved after calibration has been carried out; this is completely sufficient for the example of embodiment and application example described above.

LIST OF REFERENCES 100 system
10 microcontroller unit
12 timer unit of the microcontroller unit 10
20 data line
30 send/receive module
32 control logic
34 binary counter
36 calibration unit
38 clock generator unit, particularly oscillator unit
380 capacitive element of the clock generator unit 38
382 first digital switch of the clock generator unit 38
384 second digital switch of the clock generator unit 38
386 third digital switch of the clock generator unit 38
388 fourth digital switch of the clock generator unit 38
390 first ohmic resistance of a resistance chain in the clock generator unit 38
392 second ohmic resistance of a resistance chain in the clock generator unit 38
394 third ohmic resistance of a resistance chain in the clock generator unit 38
396 fourth ohmic resistance of a resistance chain in the clock generator unit 38
398 fifth ohmic resistance of a resistance chain in the clock generator unit 38
CAL calibration value
COM (calibration) command signal
$f_{out}$ output frequency of the clock generator unit 38

K communication parameter with K=0 no communication K=1 communication
OFL run or overflow respectively
SET set
STA start/stop
STE stage value
t time(axis)
TIM measured time duration generated by the clock generator unit 38=measured time interval generated by the clock generator unit 38

The invention claimed is:

1. A system
having at least one microcontroller unit and
having at least one transmitting/receiving module which has at least one clock generator unit, in particular at least one oscillator unit,
where the microcontroller unit and the transmitting/receiving module are connected to one another for communication over at least one data line,
characterized in that
in order to calibrate the clock frequency of the clock generator unit at least one calibration unit is assigned to the clock generator unit,
the calibration unit can be set in binary terms by means of at least one command signal via the data line,
the clock generator unit is assigned at least one binary counter that is clocked by the clock generator unit, in particular by the output frequency of the clock generator unit and
within the transmitting/receiving module there is at least one control logic mechanism which is connected to the calibration unit or to the binary counter, which control logic mechanism, following reception of the command signal, resets the binary counter, start it and awaits the expiry or overflow of the binary counter.

2. A system as claimed in claim 1, characterized in that the binary setting range, in particular the number of setting steps, of the calibration unit corresponds to a power of two.

3. A system as claimed in claim 1, wherein the system is included in at least one of the group consisting of:
a contactless chip card in at least one of an identification system and an access control system;
a device for an immobilizer in a motor vehicle key;
an electronic luggage tag for automatic distribution and sorting of items of luggage during luggage handling; and
an electronic memory or sorting and tracking transport of a package.

4. A method of calibrating the clock frequency of at least one clack generator unit, in particular oscillator unit, that is assigned to at least on transmitting/receiving module, wherein
the transmitting/receiving module communicates with at least one microcontroller unit over at least one data line and
the clock generator unit is assigned at least one calibration unit, which method has the following steps:
[a] assumption of a starting value for the calibration value of the clock generator unit;
[b.1] composition and transmission of at least one command signal over the data line;
[b.2] binary setting of the calibration value by means of the command signal;
[c] measurement of the time which passes until expiry or overflow of at least one binary counter that is assigned to the clock generator unit and is clocked by the generator unit, in particular by the output frequency of the clock generator unit, by observing at least one signal on the data line, said signal being generated by the transmitting/receiving module;
[d] comparison of the time measured in step [c] with the expected time corresponding to the number of counting steps of the binary counter divided by the desired frequency of the clock generator unit;
[e] if the time measured in step [c] does not correspond to the expected time:
correction of the calibration value, in particular using the method of successive approximation, and repetition of the measurement of the time starting from step [b.1].

5. A method as claimed in claim 4, characterized in that step [a] comprises the following individual steps:
[a.1] assumption of an imperceptible staffing value for the calibration value of the clock generator unit;
[a.2] setting of a step value to half the binary setting range for the calibration value, where the binary setting range of the calibration unit corresponds to a power of two;
[a.3] setting of the new calibration value as the sum of the starting value from step [a.1] and the step value from step [a.2].

6. A method as claimed in claim 4, characterized in that step [e] is configured as follows and
steps [f], [g], [h] come after step [e] as follows:
[e] if the time measured in step [c] is shorter that the expected time:
setting of the new calibration value as the difference between the calibration value from step [a.3] and the step value from step [a.2] or from step [f];
[f] setting of the step value to half the step value up to now;
[g] if the step value set in step [f] is greater than or equal to 1:
setting of the new calibration value as the sum of the calibration value from step [e] and. the step value from step [f];
[h] go to step [b.1].

7. A method as claimed in claim 6, characterized in that the last-used calibration value from step [e] is set as the starting value for a subsequent recalibration in step [a].

8. A method as claimed in claim 6, characterized in that the time in step [c] is measured using at least one timer unit that is assigned to the microcontroller unit and has a clock frequency of, for example, approximately one megahertz.

9. A method as claimed in claim 4, characterized in that the expected time is shortened by half the remaining tolerance.

10. A method as claimed in claim 4, characterized in that the command signal, after calibration has been carried out, is executed at least once more and the result is checked.

11. An apparatus for calibrating a clock frequency, comprising:
a transmitting/receiving module for communicating with a microcontroller unit over a data line; and
a clock generator unit that is assigned to a calibration unit and the transmitting/receiving module for generating a calibration value, composing and transmitting a command signal over the data line, measuring a time period that passes until an expiration or overflow of a binary counter that monitors the command signal and is assigned to and clocked by the clock generator unit, Comparing the time period to an expected time period corresponding to a number of counting steps of the binary counter divided by a desired frequency of the clock generator unit, and adjusting the calibration value when the time period does not correspond to the expected time period.

12. The apparatus of claim 11, wherein the transmitting/receiving module, clock generator unit, calibration unit and binary counter together are a contactless chip card and an access control system.

13. The apparatus of claim 11, wherein the transmitting/receiving module, clock generator unit, calibration unit and binary counter together are an immobilizer device in a motor vehicle key.

14. The apparatus of claim 11, wherein the transmitting/receiving module, clock generator unit, calibration unit and binary counter together are an electronic luggage tag for automatic distribution and sorting of items of luggage during luggage handling.

15. The apparatus of claim 11, wherein the transmitting/receiving module, clock generator unit, calibration unit and binary counter together are an electronic memory for sorting and tracking transport of a package.

* * * * *